(12) United States Patent
Lin et al.

(10) Patent No.: US 12,336,343 B2
(45) Date of Patent: Jun. 17, 2025

(54) ELECTRONIC DEVICE

(71) Applicant: InnoLux Corporation, Miao-Li County (TW)

(72) Inventors: Hsiao-Lang Lin, Miao-Li County (TW); Tsung-Han Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/377,292

(22) Filed: Oct. 5, 2023

(65) Prior Publication Data

US 2024/0040889 A1 Feb. 1, 2024

Related U.S. Application Data

(63) Continuation of application No. 16/246,540, filed on Jan. 13, 2019, now abandoned.

(51) Int. Cl.
| | |
|---|---|
| *H10H 20/851* | (2025.01) |
| *F21V 8/00* | (2006.01) |
| *G02F 1/1333* | (2006.01) |
| *G02F 1/1335* | (2006.01) |
| *G02F 1/13357* | (2006.01) |
| *G02F 1/1337* | (2006.01) |
| *G02F 1/1343* | (2006.01) |
| *G02F 1/1368* | (2006.01) |
| *H01L 25/16* | (2023.01) |
| *H10H 20/84* | (2025.01) |

(Continued)

(52) U.S. Cl.
CPC ....... *H10H 20/8515* (2025.01); *G02B 6/0003* (2013.01); *G02F 1/133528* (2013.01); *G02F 1/133617* (2013.01); *G02F 1/133723* (2013.01); *G02F 1/134309* (2013.01); *G02F 1/1368* (2013.01); *H01L 25/167* (2013.01); *H10H 20/84* (2025.01); *H10H 20/8512* (2025.01); *H10K 50/865* (2023.02); *H10K 59/122* (2023.02); *H10K 59/126* (2023.02); *H10K 59/38* (2023.02); *H10K 77/10* (2023.02); *G02F 1/133357* (2021.01); *G02F 1/133548* (2021.01); *G02F 1/133614* (2021.01); *G02F 2201/123* (2013.01); *G02F 2202/36* (2013.01); *G02F 2203/30* (2013.01); *H10K 2102/331* (2023.02)

(58) Field of Classification Search
None
See application file for complete search history.

(56) References Cited

U.S. PATENT DOCUMENTS

| | | | |
|---|---|---|---|
| 10,304,813 B2* | 5/2019 | Kuo | H10H 20/854 |
| 11,943,987 B2* | 3/2024 | Lee | H10K 50/865 |

(Continued)

FOREIGN PATENT DOCUMENTS

| | | |
|---|---|---|
| JP | WO 2011/105157 A1 | 9/2011 |
| KR | 10-2018-0013602 A | 2/2018 |

*Primary Examiner* — Nishath Yasmeen
(74) *Attorney, Agent, or Firm* — Winston Hsu

(57) ABSTRACT

An electronic device includes a substrate, a shielding structure disposed on the substrate, and a layer disposed on the substrate. The substrate includes an edge, and the shielding structure is disposed close to the edge. The shielding structure includes a first surface away from the substrate, a first step and a second step. In a cross-section view of the electronic device, the layer is contacted with the first surface, the first step and the second step.

9 Claims, 10 Drawing Sheets

(51) Int. Cl.
*H10K 50/86* (2023.01)
*H10K 59/122* (2023.01)
*H10K 59/126* (2023.01)
*H10K 59/38* (2023.01)
*H10K 77/10* (2023.01)
*H10K 102/00* (2023.01)

(56) References Cited

U.S. PATENT DOCUMENTS

| | | | |
|---|---|---|---|
| 2007/0291385 A1* | 12/2007 | Kim | G02B 5/201 |
| | | | 359/885 |
| 2014/0071381 A1* | 3/2014 | Jang | F21V 9/30 |
| | | | 362/97.3 |
| 2016/0370646 A1* | 12/2016 | Nishiyama | G03F 7/0007 |
| 2016/0372528 A1* | 12/2016 | Kamura | H10K 30/87 |
| 2017/0133357 A1* | 5/2017 | Kuo | H10H 20/855 |
| 2018/0017829 A1* | 1/2018 | Chae | G02F 1/133512 |
| 2018/0101056 A1* | 4/2018 | Lee | G02F 1/133528 |
| 2018/0113354 A1* | 4/2018 | Zhang | G02F 1/133514 |
| 2018/0210280 A1* | 7/2018 | Chen | G02F 1/1343 |
| 2018/0210282 A1* | 7/2018 | Song | G02B 5/22 |
| 2019/0081282 A1* | 3/2019 | Li | H10K 59/38 |

* cited by examiner

ELECTRONIC DEVICE

CROSS REFERENCE TO RELATED APPLICATIONS

This application is a continuation application of U.S. application Ser. No. 16/246,540, filed on Jan. 13, 2019. The content of the application is incorporated herein by reference.

BACKGROUND OF THE DISCLOSURE

1. Field of the Disclosure

The present disclosure relates to an electronic device, and more particularly to an electronic device including a light blocking substrate.

2. Description of the Prior Art

In the conventional lighting devices, light converting materials (such as quantum dots) are usually excited by an input light, and the input light will be converted into another light with different wavelength. However, the conversion efficiency of light converting materials may not be 100%, thereby causing the output light impure or degrading the quality. Therefore, the present disclosure proposes a lighting device that can reduce the above problems.

SUMMARY OF THE DISCLOSURE

In some embodiments, an electronic device includes a substrate, a shielding structure disposed on the substrate, and a layer disposed on the substrate. The substrate includes an edge, and the shielding structure is disposed close to the edge. The shielding structure includes a first surface away from the substrate, a first step and a second step. In a cross-section view of the electronic device, the layer is contacted with the first surface, the first step and the second step.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. For purposes of illustrative clarity understood, various drawings of this disclosure show a portion of the electronic device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to".

When an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented.

The terms "about", "substantially", "equal", or "same" generally mean within 20% of a given value or range, or mean within 10%, 5%, 3%, 2%, 1%, or 0.5% of a given value or range.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

The technical features in different embodiments described in the following can be replaced, recombined, or mixed with one another to constitute another embodiment without departing from the spirit of the present disclosure.

Figure 1:
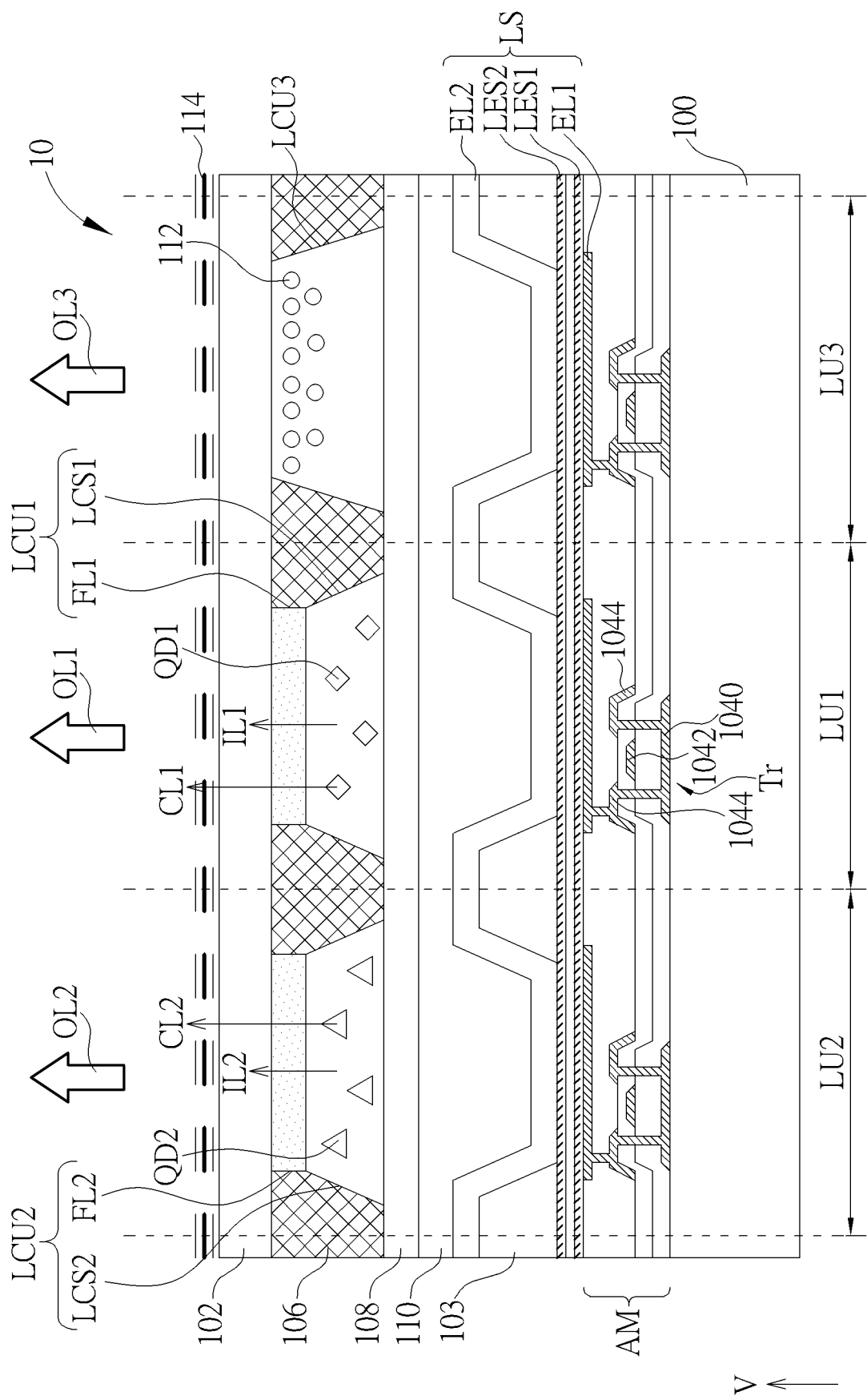
FIG. 1 is a schematic diagram illustrating a cross-sectional view of a lighting device according to a first embodiment of the present disclosure.

Referring to FIG. 1, it is a schematic diagram illustrating a cross-sectional view of a lighting device according to a first embodiment. The lighting device may include a display device, an electronic device, a flexible device, a tile device, or other suitable devices, but not limited thereto. For example (FIG. 1), the lighting device 10 may include organic light emitting diodes (OLED), quantum dot light emitting diodes (QLED, QDLED), but not limited thereto. The lighting device 10 may include a first substrate 100, a second substrate 102, and a light source LS. The second substrate 102 may be disposed opposite to the first substrate 100, and the light source LS may be disposed between the first substrate 100 and the second substrate 102, but not limited thereto. The light source LS may include at least one light emitting structure LES, a plurality of first electrodes EL1, and a second electrode EL2, but not limited thereto. For example (FIG. 1), the light source LS may include two light emitting structures LES1 and LES2, and the light emitting structures LES1 or LES2 may include organic light emitting material, quantum dot light emitting material, other suitable materials or combinations thereof, but not limited thereto. In some embodiments, the light emitting structures LES1 and/or LES2 can emit blue light, UV light or other suitable light, but not limited thereto. In some embodiments, the light emitting structure LES1 and/or LES2 may be continuously, the light emitting structures LES1 and/or LES2 may extend through a plurality of lighting units (e.g. lighting units LU1, LU2, and LU3). In some embodiments (not shown), the light emitting structure LES1 and/or LES2 may have separate patterns, and one of the separate patterns may be disposed in one of the lighting units, but not limited thereto.

In addition, the emitting structure LES1 and/or LES2 may be disposed between the first electrodes EL1 and the second electrode EL2. One of the first electrodes EL1 may be disposed in (or correspond to) one of the lighting units (e.g. LU1, LU2, or LU3), and the second electrode EL2 be continuously, the second electrode EL2 may extend through the lighting units LU1, LU2, and LU3, but not limited thereto. The second electrode EL2 may be one of cathode and anode, and the first electrodes EL1 may be another one of cathode and anode. The material of the second electrode EL2 may include transparent conductive material, such as indium tin oxide (ITO), indium zinc oxide (IZO), indium gallium zinc oxide (IGZO), indium tin zinc oxide (ITZO), antimony tin oxide (ATO), antimony zinc oxide (AZO), any other suitable materials or combinations thereof, but not limited thereto. The material of the first electrodes EL1 may include reflective conductive material (e.g. metal or alloy), but not limited thereto. Additionally, the lighting device 10 may include a plurality of walls 103 (e.g. the unit (pixel) definition layer) disposed between the at least one light emitting structure (the light emitting structure LES1 or LES2) and the second substrate 102. Specifically, the walls 103 may be disposed between the second electrode EL2 and the light emitting structure LES1 (or LES2). In some embodiments, the light emitting structure LES1 (or LES2) may be disposed on the plurality of walls 103. In some embodiments, the lighting units may be defined by the walls, but not limited. In some embodiments, the lighting units may be defined by other suitable material, such as shielding structure 106 (the details will be explained below). The material of the walls 103 may include opaque insulating material, such as reflective materials or light shielding materials, but not limited thereto.

An active matrix layer AM may be disposed on the first substrate 100. The active matrix layer AM may include plural transistors Tr. The lighting units LU1, LU2, and LU3 may respectively include at least one transistor Tr, and the first electrodes EL1 may be electrically connected to the corresponding transistor Tr, but not limited thereto. The transistor Tr may include an active layer 1040, a gate electrode 1042, a source electrode/drain electrode 1044. The active matrix layer AM may also include signal lines (such as scan line, data line, power line or reference line), insulating layers or other components. The first substrate 100 may be an array substrate. The first substrate 100 and/or the second substrate 102 may include a rigid substrate (such as a glass substrate or a quartz substrate) or a flexible substrate (such as a plastic substrate), but not limited thereto. The material of the plastic substrate may include polyimide (PI), polycarbonate (PC) or polyethylene terephthalate (PET), but not limited thereto.

A shielding structure 106 may be adjacent to the light converting units. The shielding structure 106 may include a plurality of apertures, and one light converting unit (such as the first light converting unit LCU1, the second light converting unit LCU2 or the third light converting unit LCU3) may be disposed in (or correspond to) the corresponding aperture of the shielding structure 106. The material of the shielding structure 106 may include black photoresist, black printing ink, black resin, other suitable material or combinations thereof, but not limited thereto. In addition, a planarization layer 108 may be disposed between the shielding structure 106 and the light source LS. In some embodiments, the planarization layer 108, the shielding structure 106, the first light converting unit LCU1, the second light converting unit LCU2, and the third light converting unit LCU3 may be formed on the second substrate 102, and the second substrate 102 may be a so-called color filter substrate or protective substrate, but not limited. The first light converting units LCU1, the second light converting units LCU2, and the third light converting units LCU3 may be disposed between the second substrate 102 and the light source LS, but not limited thereto. In some embodiments, the shielding structure 106, the first light converting unit LCU1, the second light converting unit LCU2, or the third light converting unit LCU3 may be formed on the first substrate 100. In some embodiments, an adhesion layer 110 may be disposed between the planarization layer 108 and the light source LS. In addition, an anti-reflection layer 114 may be disposed on a surface of the second substrate 102, and the surface may be away from the light source LS.

It should be noted that, one of the lighting units LU1, LU2, or LU3 may correspond to one of the apertures of the shielding structure 106. For example, one lighting unit (such as the lighting unit LU1, LU2, or LU3) may correspond to all elements (or layers) in a vertical region of one aperture of the shielding structure 106 in the normal direction V of the first substrate 100 (or a normal direction V of the second substrate 102). In some embodiments, the lighting unit may be a sub-pixel (such as red sub-pixel, green sub-pixel, or blue sub-pixel, but not limited thereto).

The first light converting unit LCU1 may include a light converting structure LCS1 and a filter layer FL1, and the second light converting unit LCU2 may include a light converting structure LCS2 and a filter layer FL2. The filter layer FL1 (or the filter layer FL2) may disposed between the light converting structure LCS1 (or the light converting structure LCS2) and the second substrate 102, but not limited. The light converting structure LCS1 or the light converting structure LCS2 may include quantum dots, fluorescent materials, phosphorescent materials, color filter layer, other suitable materials or combinations thereof, but not limited thereto. The quantum dots may be made of a semiconductor nano-crystal structure, and can include CdSe, CdS, CdTe, ZnSe, ZnTe, ZnS, HgTe, InAs, $Cd_{1-x}Zn_xSe_{1-y}S_y$, CdSe/ZnS, InP or GaAs, but not limited thereto. Quantum dots generally have a particle size between 1 nanometer (nm) and 30 nm, 1 nm and 20 nm, or 1 nm and 10 nm, but not limited thereto. In some embodiments, quantum dots are excited by an input light emitted by the light source LS, the input light will be converted into an emitted light with different wavelength. The color (or wavelength) of the emitted light may be adjusted by the material or size of the quantum dots. In other embodiments, the quantum dots may include sphere particles, rod particles or particles with any other suitable shapes as long as the quantum dots could emit light with suitable color (or wavelength). In addition, the filter layers FL1 and FL2 may include color filter layers. For example, the filter layer FL1 may include a green color filter layer, the filter layer FL2 may include a red color filter layer, but not limited thereto. In some embodiments, the filter layers FL1 and FL2 may include Bragg layers. In some embodiments, the filter layers FL1 and FL2 may selectively be deleted or replaced.

As shown in FIG. 1, the light converting structure LCS1 may include quantum dots QD1, the quantum dots QD1 can be excited by a portion of the input light IL1 and the portion of the input light IL1 may be converted into a light CL1 by the quantum dots QD1. A first light OL1 may be the mixture of the light CL1 and the unconverted input light IL1. In the first lighting unit LU1 shown in FIG. 1, the intensity of the unconverted input light IL1 can be reduced by the filter layer FL1 or the second substrate 102 when the unconverted input light IL1 penetrates through (or pass through) the filter layer FL1 or the second substrate 102. The second substrate 102 can reduce at least part of the unconverted input lights IL1. Accordingly, the first light OL1 may be an output light emitted from the first lighting unit LU1. The output light could be regarded as the final visual light of the lighting device 10 perceived by the observer. The light converting structure LCS2 may include quantum dots QD2, the quantum dots QD2 can be excited by a portion of the input light IL2, and the portion of the input light IL2 may be converted into a light CL2 by the quantum dots QD2. The quantum dots QD2 may be different from the quantum dots QD1. A second light OL2 may be the mixture of the light CL2 and the unconverted input light IL2. In the second lighting unit LU2 shown in FIG. 1, the intensity of the unconverted input light IL2 can be reduced by the filter layer FL2 or the second substrate 102 when the unconverted input light IL2 penetrates through (or pass through) the filter layer FL2 or the second substrate 102. Accordingly, the second light OL2 may be an output light emitted from the second lighting unit LU2.

In some embodiments, a third light OL3 emitted by the lighting unit LU3 can be blue light, but not limited. In some embodiments, the light source LS emits blue light, the third light converting unit LCU3 may include a transparent layer, which has no quantum dots therein. Additionally, the third light converting unit LCU3 may also include some scattering particles 112, but not limited thereto. In some embodiments, the third light converting unit LCU3 may include a blue color filter layer. In some embodiment, the third light converting unit LCU3 is not included in the lighting unit LU3. In some embodiments, the third light converting unit LCU3 may include suitable type of quantum dots to adjust the wavelength of the third light OL3.

In some embodiments, the first light OL1 can be green light, the second light OL2 can be red light, and the third light OL3 can be blue light, but not limited thereto. In some embodiments, the lighting device 10 may include other lighting units emitting a light with different colors (or wavelengths).

In some embodiments, the second substrate 102 may include a plurality of metal ions, a plurality of nanoparticles, or a yellowing polymer, but not limited thereto. The metal ions may include the first transition series, second transition series, third transition series, or fourth transition series, but not limited thereto. For example, the metal ions may include titanium, chromium, manganese, iron, cobalt, nickel, copper, zinc, yttrium, zirconium, molybdenum, silver, cadmium, platinum, gold, other suitable materials or combinations thereof, but not limited thereto. In some embodiments, the metal ions may be introduced by adding metal salts into the second substrate 102.

The nanoparticles may include metal oxide nanoparticles or metal nanoparticles. The metal oxide nanoparticles may include nanoparticles of titanium dioxide ($TiO_2$), zirconium dioxide ($ZrO_2$), aluminum oxide ($Al_2O_3$), indium oxide ($In_2O_3$), zinc oxide (ZnO), tin oxide ($SnO_2$), antimony oxide ($Sb_2O_3$), or silicon dioxide ($SiO_2$), but not limited thereto. The metal oxide nanoparticles may absorb (or filter) at least part of the input lights (such as blue lights). The metal nanoparticles may include nanoparticles of gold, silver, copper, platinum, iron, cobalt, nickel, or manganese, but not limited thereto. The metal nanoparticles may scatter at least part of the blue lights. In some embodiments, the metal nanoparticles may scatter at least part of the blue lights to the quantum dots, thereby increasing the conversion efficiency. In some embodiments, the nanoparticles may be formed as a thin film (or layer) on at least one of the surfaces of the second substrate 102. In some embodiments, a patterning process may be performed so that the nanoparticle thin film may have patterns (not shown), and at least part of the nanoparticle thin films (or layers) can overlap with the light converting structure LCS1 (or the light converting structure LCS2) in the normal direction V of the second substrate 102, but not limited thereto.

The yellowing polymer may include epoxy resins with high molecular weights or unsaturated polyester resins, but not limited thereto. For example, the material of the second substrate 102 includes acrylic or PI, and the epoxy resin with high molecular weight or the unsaturated polyester resin may be added in the second substrate 102, but not limited thereto. In some embodiments, an aging process may be performed to the second substrate 102 for reducing the blue light. The aging process may include chemical aging or physical aging, but not limited thereto.

Figure 2:
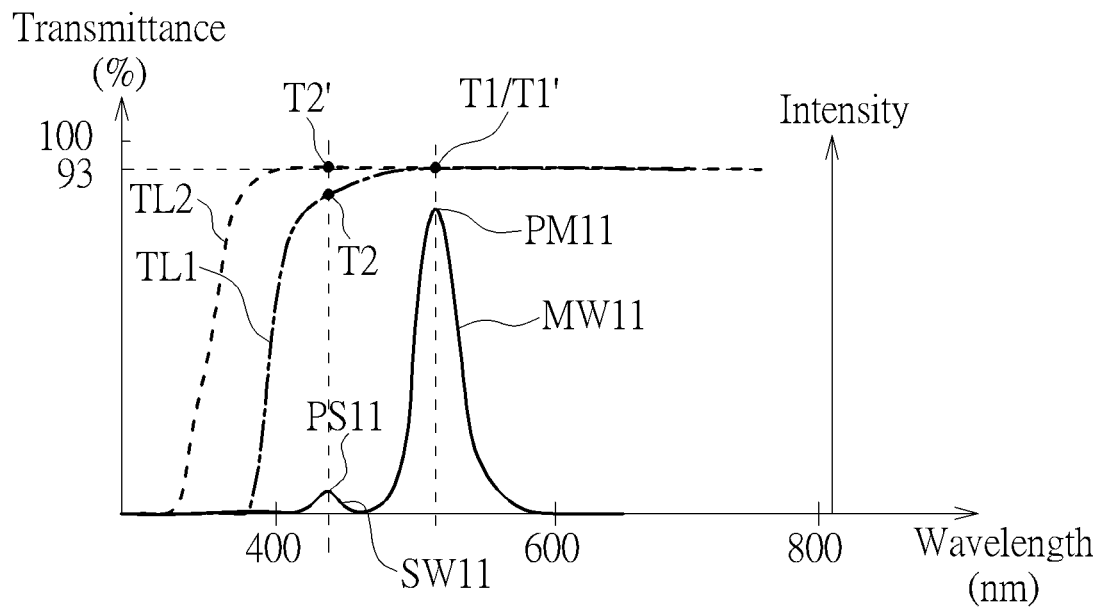
FIG. 2 is a schematic diagram illustrating the transmittance of a second substrate and a first spectrum of a first light emitted by a first lighting unit according to the first embodiment.
Figure 3:
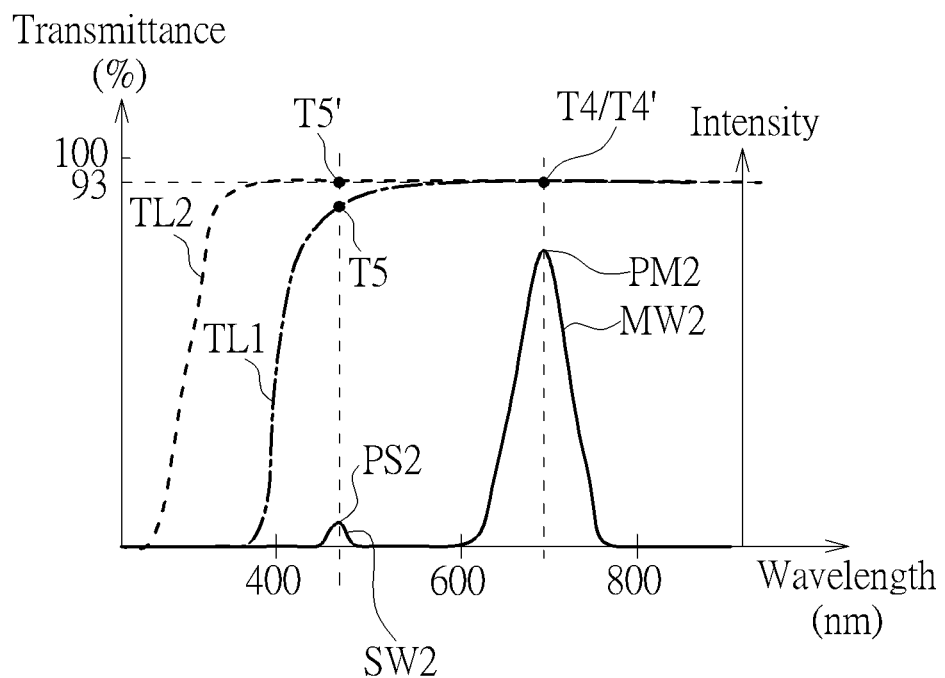
FIG. 3 is a schematic diagram illustrating the transmittance of the second substrate and a second spectrum of a second light emitted by second lighting unit according to the first embodiment.
Figure 4:
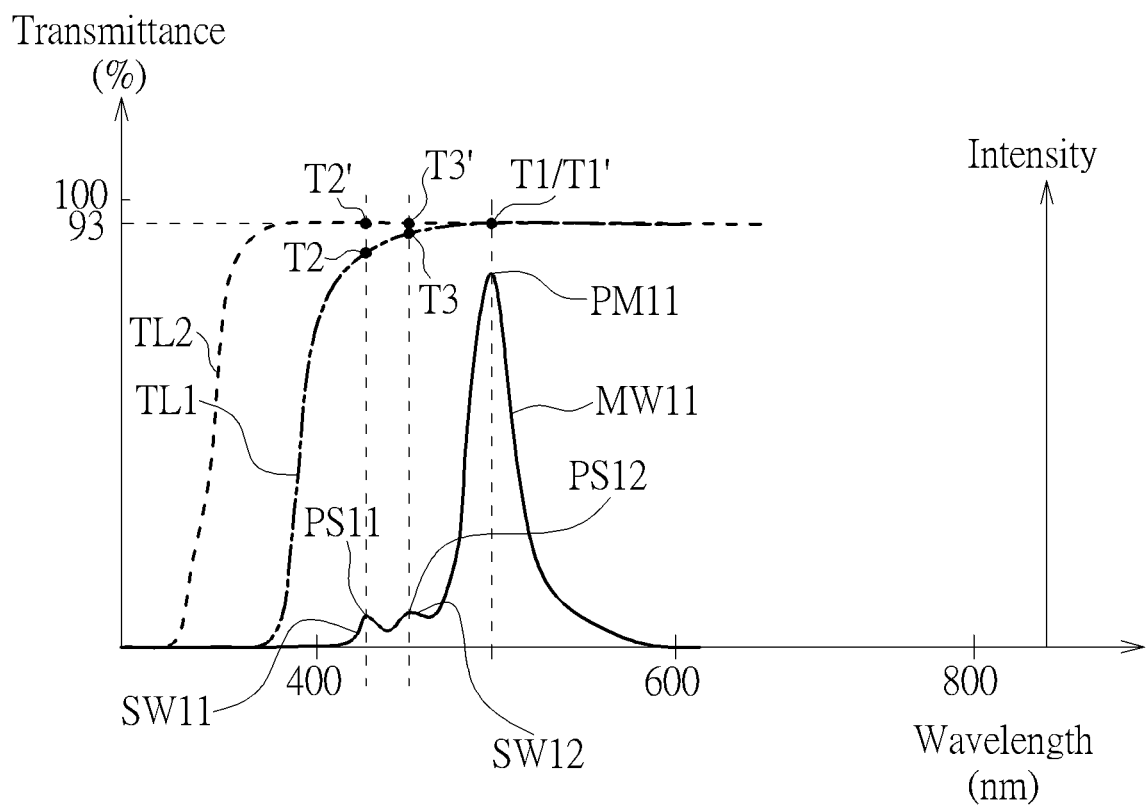
FIG. 4 is a schematic diagram illustrating the transmittance of a second substrate and a first spectrum of a first light emitted by a first lighting unit according to a variant embodiment of the first embodiment.

Referring to FIG. 2, it is a schematic diagram illustrating the transmittance (the vertical axis on the left side indicates the transmittance (%)) of the second substrate 102 and a first spectrum of the first light OL1 emitted by the first lighting unit LU1 according to the first embodiment. In FIG. 2 to FIG. 4, dash-dotted lines TL1 represent the transmittance of the second substrate 102 including at least one of the above metal ions, the nanoparticles, or the yellowing polymers. Dashed lines TL2 represent a transmittance of a common substrate, which is untreated. For example, the common substrate does not include the metal ions, the nanoparticles or the yellowing polymer. In FIG. 2, the solid line represents a first spectrum of the first light OL1, and the first spectrum may include a main wave MW11 and a sub-wave SW11. In some embodiments, the first spectrum may be a spectrum of a light emitted by the light source LS and passing through the first light converting units LCU1 and the second substrate 102. In some embodiments, the main wave MW11 may represent the light CL1 (the light is converted by the first light converting unit LCU1) after passing through the second substrate 102. The sub-wave SW11 may represent the unconverted input light IL1 (e.g. blue light), after passing through the second substrate 102.

In FIG. 2, the main wave MW11 has a main peak PM11 and the sub-wave SW11 has a first sub peak P511, the main peak PM11 is between 520 nanometers (nm) to 590 nm and the first sub peak P511 is between 430 nm to 470 nm, and the intensity (the vertical axis on the right side indicates the intensity) of the main peak PM11 is greater than the intensity of the first sub peak PS11. Additionally, "Main peak" is defined as a crest of the main wave, and "Sub peak" is defined as a highest intensity in the corresponding range of wavelength, such as the highest intensity in the range from 430 nm to 470 nm, but not limited thereto. "Main peak" and "Sub peak" in other light spectrums may also be defined by the same way described above.

Referring to FIG. 3, it is a schematic diagram illustrating the transmittance of the second substrate 102 and a second spectrum of a second light OL2 emitted by the second lighting unit LU2 according to the first embodiment. In FIG. 3, the solid line represents a second spectrum of the second light OL2, and the second spectrum may include a main wave MW2 and a sub-wave SW2. In this embodiment, the second spectrum may be a spectrum of a light emitted by the light source LS and passing through the second light converting units LCU2 and the second substrate 102. The main wave MW2 may represent the light CL2 (the light converted by the second light converting unit LCU2) after passing through the second substrate 102. The sub-wave SW2 may represent the unconverted input light IL2 (e.g. blue light) after passing through the second substrate 102. Referring to FIG. 3 (the vertical axis on the right side indicates the intensity), the main wave MW2 has a main peak PM2 and the sub-wave SW2 has a sub peak PS2, the main peak PM2 is between 591 nm to 780 nm and the sub peak PS2 is between 430 nm to 470 nm, and the intensity of the main peak PM2 is greater than the intensity of the sub peak PS2.

As shown in the dash-dotted lines TL1 in FIG. 2 and FIG. 3, a first transmittance T1 of the second substrate 102 at a wavelength of the main peak PM11 is greater than a second transmittance T2 of the second substrate 102 at a wavelength of the first sub peak PS11, or a fourth transmittance T4 of the second substrate 102 at a wavelength of the main peak PM2 is greater than a fifth transmittance T5 of the second substrate 102 at a wavelength of the sub peak PS2. In some embodiments, the first transmittance T1 (or the fourth transmittance T4) may be in a range from 91% to 95% (91%≤transmittance≤95%), and the second transmittance T2 and/or the fifth transmittance T5 may be less than the first transmittance T1 (or the fourth transmittance T4). As shown in the dashed lines TL2 in FIG. 2 and FIG. 3, when the common substrate is untreated, a transmittance T1' of the common substrate at a wavelength of the main peak PM11 and a transmittance T2' of the common substrate at a wavelength of the first sub peak PS11 are approximately the same, or a transmittance T4' of the common substrate at a wavelength of the main peak PM2 and a transmittance T5' of the common substrate at a wavelength of the sub peak PS2 are approximately the same. When the second substrate 102 is treated, for example, the second substrate 102 may include the metal ions, the nanoparticles, or the yellowing polymer, the transmittance of the second substrate 102 at the wavelength of the first sub peak P511 (or second sub peak PS2) may be reduced.

Table 1 illustrates the second transmittance T2 (or the fifth transmittance T5) of the second substrate 102 when the second substrate 102 includes one of the metal ions, the nanoparticles, and the yellowing polymer (for example, groups A, E and I in the table 1), or the second substrate 102 may include the combination of two of these materials (for example, groups B, C D, F, G and H in the table 1). Taking the group A as an example, the value represents the transmittance of the second substrate 102 when it includes 1-20 wt % metal ions, and the second transmittance T2 (or the fifth transmittance T5) may be in a range from 90-91% (90%≤transmittance≤91%). Taking the group B as an example, the value represents the transmittance of the second substrate 102 with 1-20 wt % metal ions and 1-20 wt % nanoparticles, and the second transmittance T2 (or the fifth transmittance T5) may be in a range from 72-82% (72%≤transmittance≤82%). Other groups (such as groups C-I) are similar, so not be repeated.

TABLE 1

| Transmittance (%) (T2 or T5) | Metal ions | Nanoparticles | Yellowing polymer |
|---|---|---|---|
| Metal ions | A: 90-91% | B: 72-82% | C: 76-82% |
| Nanoparticles | D: 72-82% | E: 80-90% | F: 67-81% |
| Yellowing polymer | G: 76-82% | H: 67-81% | I: 84-90% |

In addition, Table 2 illustrates the ratio of the second transmittance T2 to the first transmittance T1 (or the ratio of the fifth transmittance T5 to the fourth transmittance T4) when the second substrate 102 includes one of the metal ions, the nanoparticles and the yellowing polymer (for example, groups A, E and I in the table 2), or the combination of two of these materials (for example, groups B, C D, F, G and H in the table 2). Taking the group A as an example, the value represents a ratio of the second transmittance T2 to the first transmittance T1 (T2/T1) (or a ratio of the fifth transmittance T5 to the fourth transmittance T4 (T5/T4)) when the second substrate 102 includes 1-20 wt % metal ions, and the ratio may be in a range from 97% to 98% (97%≤ratio≤98%). Taking the group B as an example, the value represents a ratio of the second transmittance T2 to the first transmittance T1 (T2/T1) (or a ratio of the fifth transmittance T5 to the fourth transmittance T4 (T5/T4)) when the second substrate 102 includes 1-20 wt % metal ions and 1-20 wt % nanoparticles, and the ratio may be in a range from 77% to 88% (77%≤ratio≤88%). Other groups (such as groups C-I) are similar, so not be repeated. According to groups A-I in table 2, the ratio of the second transmittance T2 to the first transmittance T1 may be in a range from 72% to 98%.

TABLE 2

| Ratio (T2/T1 or T5/T4) | Metal ions | Nanoparticles | Yellowing polymer |
|---|---|---|---|
| Metal ions | A: 97-98% | B: 77-88% | C: 81-88% |
| Nanoparticles | D: 77-88% | E: 86-97% | F: 72-87% |
| Yellowing polymer | G: 81-88% | H: 72-87% | I: 90-97% |

Referring to FIG. 4, it is a schematic diagram illustrating the transmittance of a second substrate 102 and a first spectrum of a first light OL1 emitted by a first lighting unit LU1 according to a variant embodiment of the first embodiment. Different from the FIG. 2, the first spectrum (FIG. 4) may include a sub-wave SW12 and the sub-wave SW11, and the sub-wave SW12 may represent different portions of the unconverted input light IL1 in the first light OL1. Referring to FIG. 4 (the vertical axis on the right side indicates the intensity), the sub-wave SW12 has a second sub peak PS12 between 470 nm to 510 nm, and the intensity of the second sub peak PS12 is less than the intensity of the main peak PM11. "First sub peak" and "Second sub peak" are defined as the highest intensities in the corresponding ranges of wavelength, such as the highest intensity in the range from 430 nm to 470 nm and the highest intensity in the range from 470 nm to 510 nm, but not limited thereto. As shown in the dash-dotted line TL1 in FIG. 4, a first transmittance T1 of the second substrate 102 at the wavelength of the main peak PM11 is greater than a third transmittance T3 of the second substrate 102 at a wavelength of the second sub peak PS12, and a ratio of the third transmittance T3 to the first transmittance T1 (T3/T1) is in a range from 85% to 99% (85%≤ratio≤99%). In FIG. 4, the third transmittance T3 may be greater than the second transmittance T2 and less than the first transmittance T1, but not limited thereto. When the second substrate 102 includes the metal ions, the nanoparticles, or the yellowing polymer, the first transmittance T1 may be in a range from 91% to 95% (91%≤first transmittance T1≤95%), and the second transmittance T2 and the third transmittance T3 may be less than the first transmittance T1. As shown in the dashed line TL2 in FIG. 4, when the common substrate does not include the metal ions, the nanoparticles, nor the yellowing polymer, the transmittance T1' and the transmittance T2' of the common substrate are approximately the same, or the transmittance T1' and the transmittance T3' of the common substrate are approximately the same.

Figure 5:
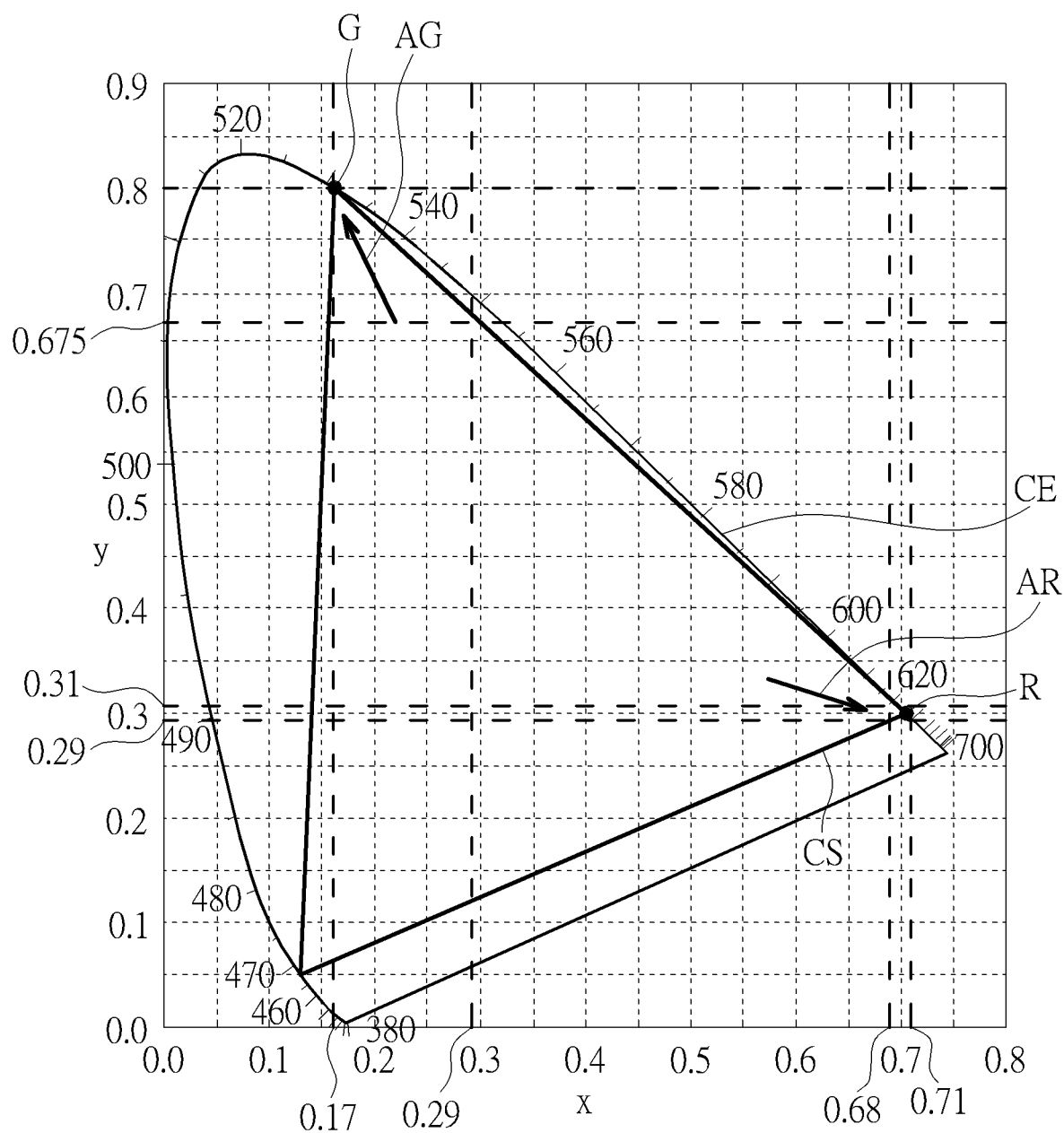
FIG. 5 is a CIE 1931 chromaticity diagram.

Referring to FIG. 5, it is a CIE 1931 chromaticity diagram, and color gamut may be commonly represented by an area in the CIE 1931 chromaticity diagram. The numbers marked along a curved edge CE may represent the wavelengths. A region CS can represent the color space of the lighting device 10, a point G may represent the green primary color, a point R may represent the red primary color. In the lighting units LU1, the intensity of the unconverted input light (such as blue light) can be reduced by the filter layer FL1 or the second substrate 102, the x-y coordinate of the first light OL1 can be close to the point G, as indicated by an arrow AG in FIG. 5. For example, a green x-coordinate value in a CIE 1931 color gamut of the lighting device 10 is in a range from 0.17 to 0.29 (0.17≤x≤0.29), and a green y-coordinate value in the CIE 1931 color gamut of the lighting device 10 is in a range from 0.675 to 0.8 (0.675≤y≤0.8). In addition, in the lighting units LU2, since the intensity of the unconverted input light (such as blue light) can be reduced by the filter layer FL2 or the second substrate 102, the x-y coordinate of the second light OL1 can be close to the point R, as indicated by an arrow AR in FIG. 5. For example, a red x-coordinate value in the CIE 1931 color gamut of the lighting device 10 is in a range from 0.68 to (0.68≤x≤0.71), and a red y-coordinate value in the CIE 1931 color gamut of the lighting device 10 is in a range from 0.29 to 0.31 (0.29≤y≤0.31). Accordingly, the lighting units LU1 or LU2 in the lighting device 10 can emit light with the color close to the red or green primary color, thereby increasing the lighting quality (or display quality).

In some embodiments, since the second substrate 102 is provided, the thickness of the filter layers FL1 and FL2 may be reduced to be less than three micrometers. Additionally, the filter layers FL1 and FL2 may be removed in some embodiments for reducing the thickness of the lighting device 10.

The technical features in different embodiments described in this disclosure can be replaced, recombined, or mixed. For making it easier to compare the difference between these embodiments, the following description will detail the dissimilarities among different embodiments and the identical features will not be redundantly described.

Figure 6:
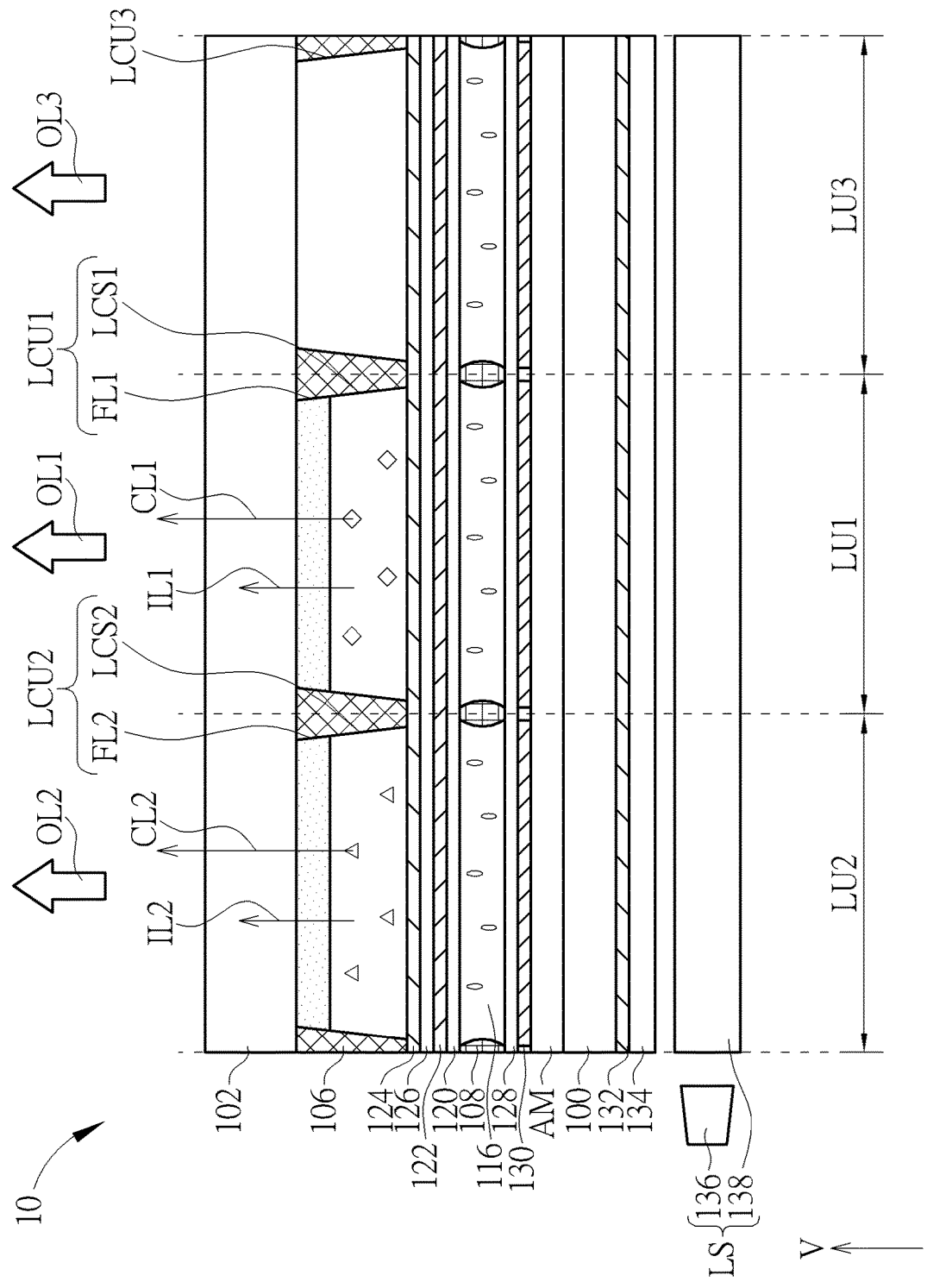
FIG. 6 is a schematic diagram illustrating a cross-sectional view of a lighting device according to a second embodiment.

Referring to FIG. 6, it is a schematic diagram illustrating a cross-sectional view of a lighting device according to a second embodiment. Different from the first embodiment, the lighting device 10 may be a liquid crystal display device, but not limited thereto. The first substrate 100 may be disposed between the light source LS and the second substrate 102, and a light modulating layer 116 may be disposed between the first substrate 100 and the second substrate 102. The light modulating layer 116 may be a liquid crystal layer, and some spacers 108 may be disposed between the first substrate 100 and the second substrate 102. An alignment layer 120, an electrode 122, and a planarization layer 126 may be disposed between the second substrate 102 and the light modulating layer 116, but not limited. An alignment layer 128, a plurality of electrodes 130, and the active matrix layer AM may be disposed between the light modulating layer 116 and the first substrate 100, but not limited.

The alignment layers 120 and 128 may be PI layers, but not limited thereto. The electrode 122 may be the common electrode and the electrodes 130 may be pixel electrodes, and the electrodes 130 may be electrically connected to at least one transistor of the active matrix layer AM, but not limited thereto. The material of the shielding structure 106 or the spacers 118 may include black photoresist, black printing ink, black resin or other suitable material or combinations thereof, but not limited thereto. The optical films 134 may include dual brightness enhancement film (DBEF), prism film, other suitable optical films, or combinations thereof, but not limited thereto. In FIG. 6, the light source LS may emit blue light, and the third light converting unit LCU3 may be replaced by a transparent layer, which has no quantum dots or scattering particles therein, but not limited thereto.

The lighting device 10 may further include a polarizer 124 and a polarizer 132. The polarizer 124 may be disposed between the planarization layer 126 and the light converting units, the polarizer 132 may be disposed between the first substrate 100 and the light source LS. However, the polarizer 124 and the polarizer 132 are not limited to be disposed at the above-mentioned locations. In some embodiments, the light modulating layer 116 may be disposed between two polarizers for adjusting gray scale. In some embodiments, the polarizer 124 and/or the polarizer 132 may be disposed between the first substrate 100 and light converting units, for example the polarizer 124 and/or the polarizer 132 may include metal wires, which can be so-called wire grid polarizer (WGP), but is not limited thereto. The material of metal wire includes metal, metal alloy, other suitable materials or combinations thereof, but is not limited thereto. In addition, the lighting device 10 may further include at least one optical film 134 disposed between the polarizer 132 and the light source LS. In some embodiments, the optical film 134 may include dual brightness enhancement film (DBEF), prism film, other suitable optical films, or combinations thereof, but not limited thereto.

In FIG. 6, the light source LS may be a backlight module. The light source LS may include a light emitting source 136 and at least one optical layer 138. The optical layer 138 may include the light guide plate, diffuser plate, reflective film or other optical films (or plates). The light source LS may be an edge-lit type backlight module, and the light emitting source 136 may be disposed near at least one of the sidewalls of the optical layer 138 (such as the light guide plate), or the light source LS and the first substrate 100 (or the second substrate 102) may be disposed at different sides of the optical layer 138, but not limited thereto. In some embodiments, the light source LS may be a direct-lit type backlight module (not shown), the optical layer 138 may be the diffuser plate, reflective film or other optical films, and the optical layers 138 (such as diffuser plate) may be disposed between the light emitting source 136 and first substrate 100, or the optical layers 138 (such as reflective film) may disposed under the light emitting source 136. The light emitting source 136 may include light emitting diode (LED), micro-LED, mini-LED, organic light-emitting diode (OLED), quantum dot light emitting diode (QLED; QDLED), quantum dot, fluorescent material, phosphor materials, other suitable light sources, or combinations thereof, but not limited thereto. In some embodiment, the backlight module can emit blue light or UV light, but not limited thereto.

Figure 7:
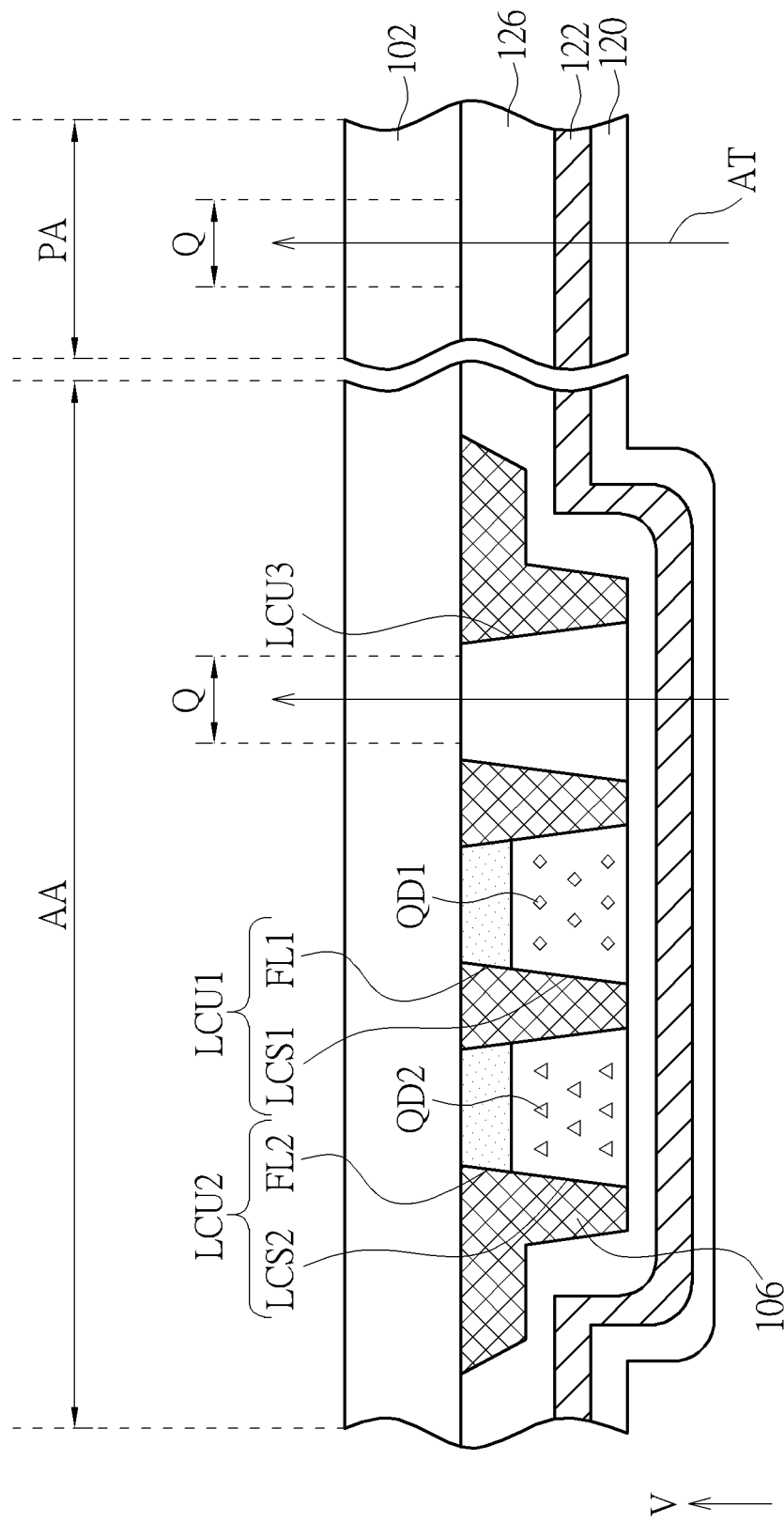
FIG. 7 is a schematic diagram illustrating a measurement of the transmittance of the second substrate.

Referring to FIG. 7, it is a schematic diagram illustrating a measurement of the transmittance of the second substrate. In some embodiments, the measurement of the transmittance (such as T1, T2, T3, T4 or T5) may be performed to a measuring location Q of the second substrate 102 after the lighting device 10 is dismantled. For example, the second substrate 102 in FIG. 7 may be dismantled from the lighting device 10 in FIG. 6, but not limited thereto. In some embodiments, the transmittance of the second substrate 102 may be measured without dismantling the lighting device 10 when the area of the second substrate 102 is larger than the area of the first substrate 100, and the measuring location Q can be chosen from a part of the second substrate 102, and the part of the second substrate 102 does not overlap with the first substrate 100 in the normal direction V of the second substrate 102, but not limited thereto. As shown in FIG. 7, the second substrate 102 may include a display region AA and a peripheral region PA, and the shielding structure 106 and the light converting units (such as LCU1, LCU2) may be disposed in the display region AA. In some embodiments, the shielding structure 106 may extend to a portion of the peripheral region PA, but not limited thereto. Referring to an arrow AT shown in FIG. 7, the transmittance of the second substrate 102 may be measured from a measuring location Q of the second substrate 102 in the peripheral region PA, but not limited thereto. In some embodiments, the transmittance of the second substrate 102 may be measured from a measuring location Q of the second substrate 102 in the display region AA.

As shown in FIG. 7, part of the planarization layer 126, part of the electrode 122, and part of the alignment layer 120 may correspond to the measuring location Q of the second substrate 102, but not limited thereto. In some embodiments, the polymer film, Bragg layer, silicon oxide film, silicon nitride film, inorganic material, organic material, or combinations thereof may be disposed on the second substrate 102 and correspond to the measuring location Q, but not limited thereto. According to the results from experiments, the above-mentioned materials may not affect or slightly affect the result of transmittance of the second substrate 102, which can be neglected.

It should be noted that, some materials should not be located in the measuring location Q while measuring the transmittance of the second substrate 102, such as the shielding structure 106, the light converting units (such as LCU1, LCU2 and LCU3), the filter (the filter layer FL1 and FL2), the polarizer 124 (such as WGP), metallic materials, other reflective materials, shading materials or light absorbing materials, but not limited. These materials should be removed from the measuring location Q by dry etching, wet etching or other methods before the measurement is performed. The wet etching may include drop etching or shower etching, for example, the acid etching solution ST849 or alkali etching solution ST823 may be used, but not limited thereto. The dry etching may include using the fast particle beam, ion beam, or atom beam to perform the bombardment of etching, but not limited thereto. Therefore, in some embodiments, the measurement may be performed to the second substrate 102 after other films disposed on the second substrate 102 are removed.

In some experiment, the measurement of the transmittance may be performed to thirty-six measuring locations of the second substrate 102 uniformly distributed in the display region AA and/or the peripheral region PA, but not limited thereto. The thirty-six measuring locations should be chosen according to criteria of the measuring location Q mentioned above.

The transmittance of the second substrate 102 may be measured by some instruments such as the spectroradiometer or color analyzer, but not limited thereto. The instruments may include CA-210, CS 1000T, CS 2000, BM5A or other suitable instruments, but not limited thereto. In addition, the spectrum of the first light OL1 or the second light OL2 may be measured by the spectroradiometer. The instrument may be disposed at a side of the emitting surface of the lighting device 10, and the emitting surface may be away from the light source LS while measuring. The lighting device 10 may turn on at least one of the lighting units LU1 (or at least one of the lighting units LU2), and the lighting device 10 may emit the first light OL1 (or the second light OL2). The lighting unit(s) LU1 or LU2 may be operated in the condition of maximum gray level while measuring, but not limited thereto.

Figure 8:
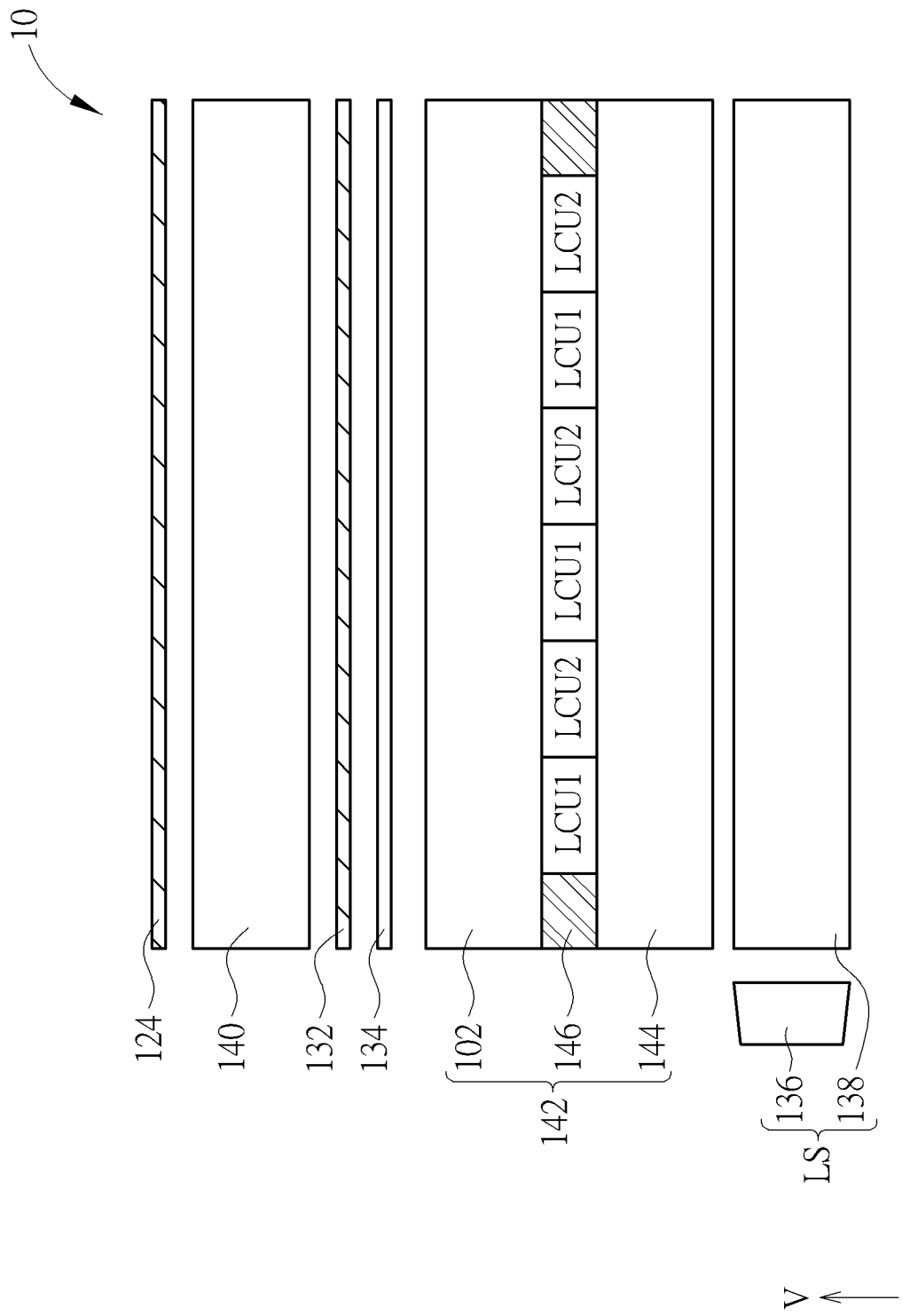
FIG. 8 is a schematic diagram illustrating a cross-sectional view of a lighting device according to a third embodiment.

Referring to FIG. 8, it is a schematic diagram illustrating a cross-sectional view of a lighting device according to a third embodiment. Different from the second embodiment, the second substrate 102 is disposed between a display panel 140 (such as liquid crystal display panel) and the light source LS. The lighting device 10 may include a quantum dot (QD) cell 142 disposed between the display panel 140 and the light source LS. The QD cell 142 includes a bottom substrate 144, the second substrate 102, the first light converting units LCU1, the second light converting units LCU2, and an adhesive layer 146. In some embodiments, the adhesive layer 146 may be a black adhesive layer, but not limited thereto. The first light converting units LCU1, the second light converting units LCU2, and the adhesive layer 146 may be disposed between the bottom substrate 144 and the second substrate 102, and the second substrate 102 is disposed on the first light converting units LCU1 and the second light converting units LCU2. In some embodiments, the adhesive layer 146 may be disposed at the periphery of the bottom substrate 144 (or the periphery of the second substrate 102), and the bottom substrate 144 and the second substrate 102 may be adhered through the adhesive layer 146. In some embodiments, the adhesive layer 146 may be adjacent to (or surrounds) the first light converting units LCU1 and the second light converting units LCU2. In some embodiment, the light source LS may be the edge-lit type backlight module, and the optical layer 138 may be a light guide, but not limited thereto. In some embodiments, the light source LS may be a direct-lit type backlight module (not shown), and the optical layer 138 may be a diffusing film or a reflective film, but not limited thereto. For example, the diffusing film may be disposed on the light source LS, or the reflective film may be disposed under the light source LS, but not limited thereto.

The light (e.g. blue light) provided by the light source LS may pass through the first light converting units LCU1 and the second light converting units LCU2, and the lights (e.g. red and green lights) emitted by the first light converting units LCU1 and the second light converting units LCU2 may pass through the second substrate 102. The lights emitted by the first light converting units LCU1 and the second light converting units LCU2 may be mixed to form white light, and portions of blue lights can be reduced by the second substrate 102. Additionally, the white light provided by the QD cell 142 may be converted into different colors (or wavelengths) by color filters of different sub-pixels disposed in the liquid crystal display panel 140, but not limited thereto. In some embodiment, the quantum dots of the first light converting units LCU1 and the quantum dots of the second light converting units LCU2 may be separated (or be patterned), the quantum dots of the first light converting units LCU1 does not overlap with the quantum dots of the second light converting units LCU2 in the normal direction V of the second substrate 102, but not limited thereto. In some embodiments, the quantum dots of the first light converting units LCU1 and the quantum dots of the second light converting units LCU2 may be mixed in a same layer, and the wavelength (or color) emitted from 142 could be modulated. In some embodiments, the substrates of the display panel 140 may be substrates that does not include the metal ions, the nanoparticles or the yellowing polymer, but not limited thereto. In some embodiments, at least one of the substrates of the display panel 140 may be replaced by the second substrate 102, in this situation, the substrate of the QD cell 142 may not include the metal ions, the nanoparticles or the yellowing polymer, but not limited thereto. The above alternative designs may be applied to the fourth embodiment or the fifth embodiment.

Figure 9:
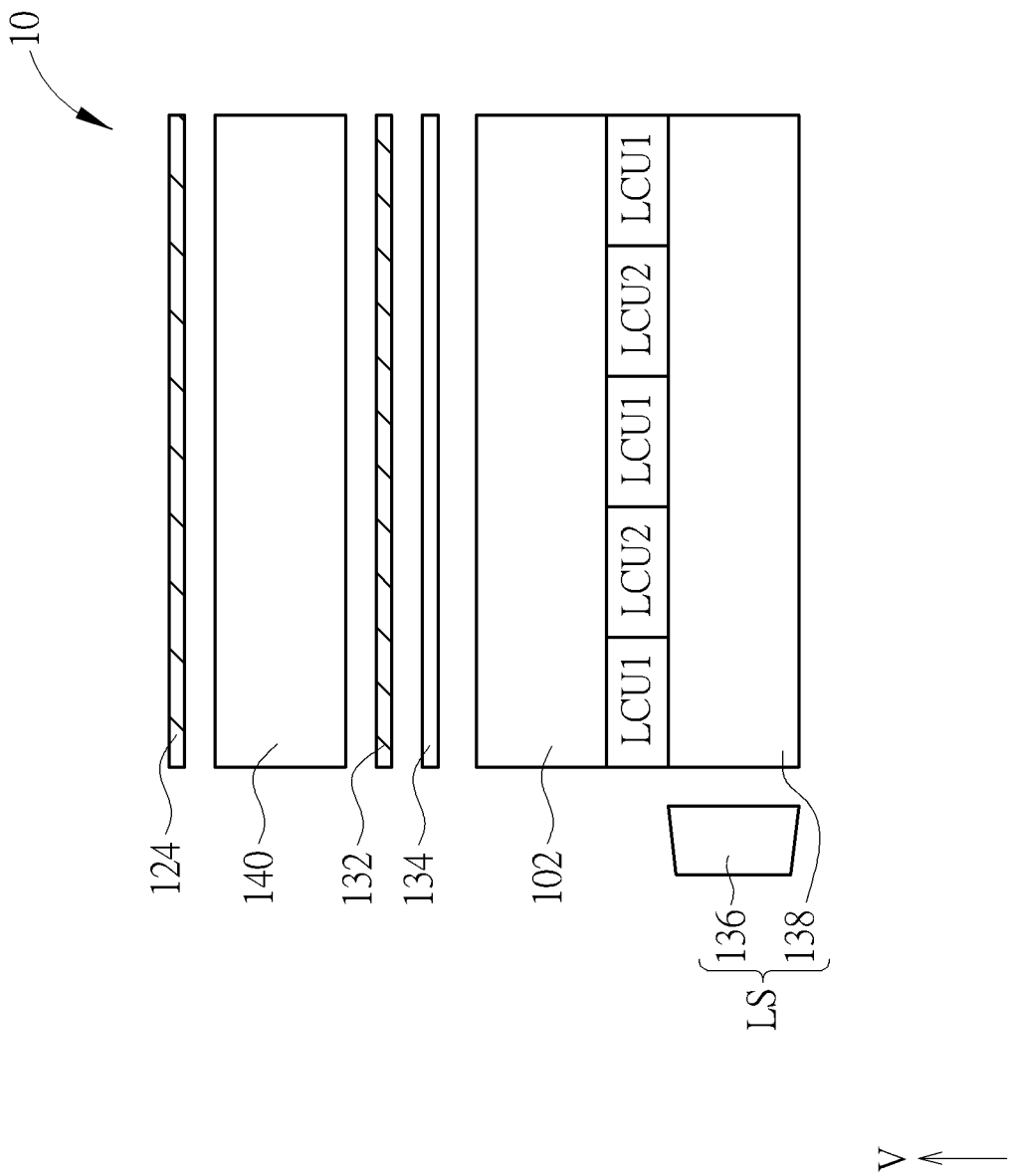
FIG. 9 is a schematic diagram illustrating a cross-sectional view of a lighting device according to a fourth embodiment.

Referring to FIG. 9, it is a schematic diagram illustrating a cross-sectional view of a lighting device according to a fourth embodiment. Different from the third embodiment, the lighting device 10 may include the quantum dot on light guide (QDOG) structure. For example, the second substrate 102, the first light converting units LCU1, and the second light converting units LCU2 may be bonded with (or coated on) the optical layer 138, and the bottom substrate 144.

Figure 10:
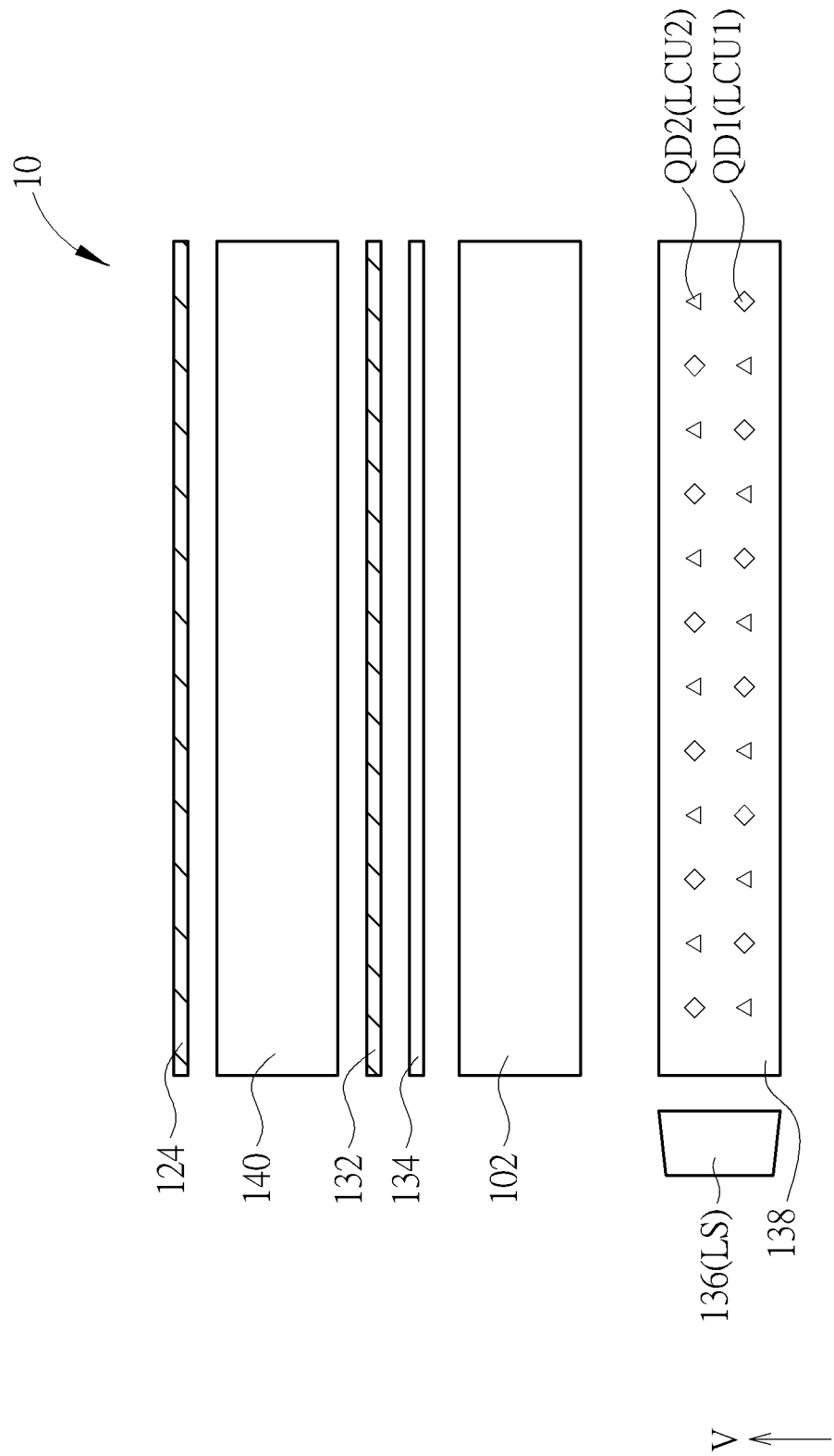
FIG. 10 is a schematic diagram illustrating a cross-sectional view of a lighting device according to a fifth embodiment.

Referring to FIG. 10, it is a schematic diagram illustrating a cross-sectional view of a lighting device according to a fifth embodiment. Different from the fourth embodiment, the lighting device 10 may include the quantum dot in light guide (QDIG) structure. For example, the light source LS may be the light emitting source 136, and the quantum dots QD1 of the first light converting units LCU1 and the quantum dots QD2 of the second light converting units LCU2 may be mixed and disposed in the optical layer 138, but not limited thereto. The second substrate 102 may be disposed on the optical layer 138. Therefore, the light source LS and the second substrate 102 may be disposed at different sides of the optical layer 138, but not limited thereto.

Figure 11:
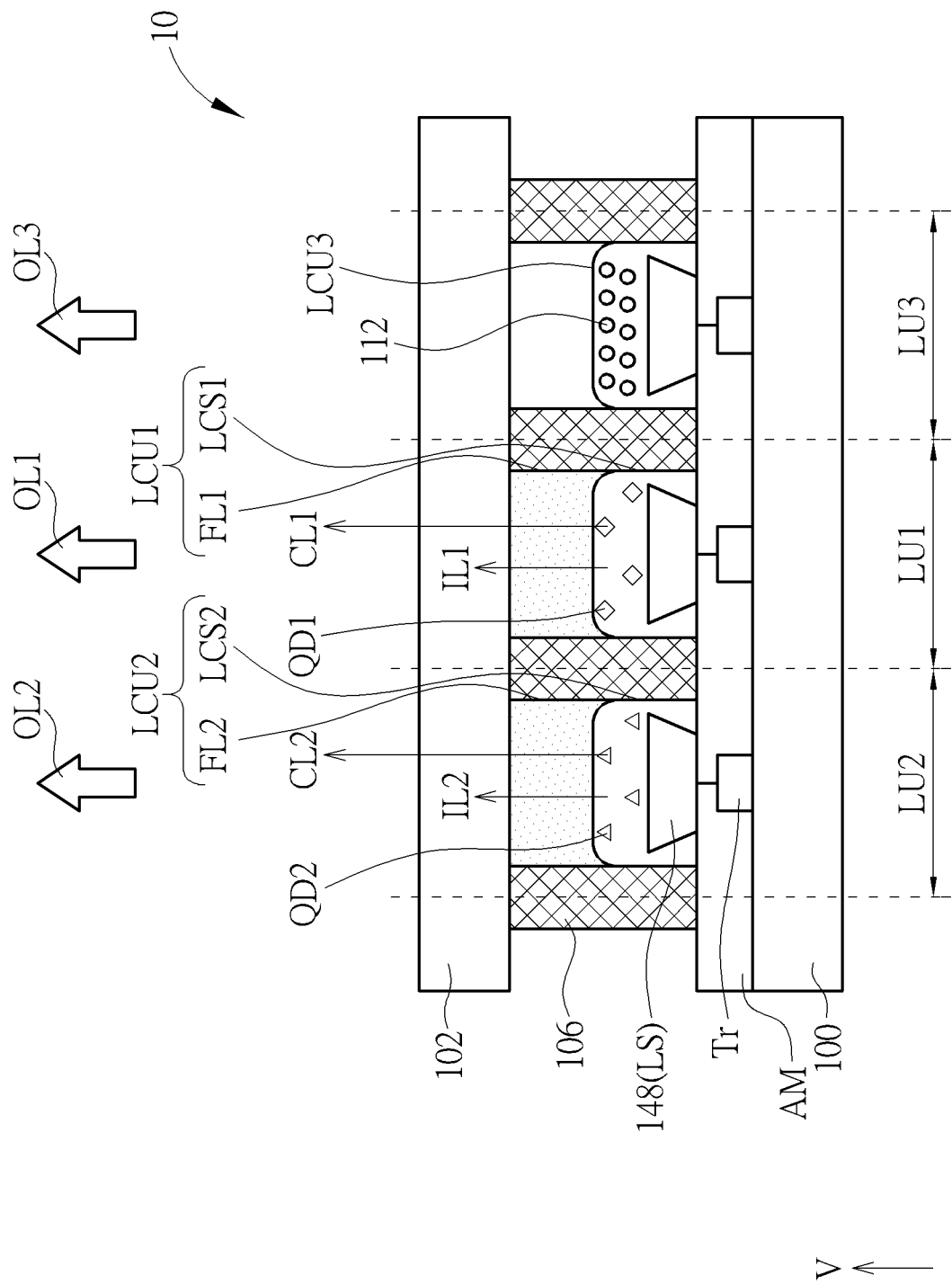
FIG. 11 is a schematic diagram illustrating a cross-sectional view of a lighting device according to a sixth embodiment.

Referring to FIG. 11, it is a schematic diagram illustrating a cross-sectional view of a lighting device according to a sixth embodiment. Different from the first embodiment, the lighting device 10 may include LED, micro LED, or mini LED but not limited thereto. As shown in FIG. 11, the light source LS may include at least one light emitting source 148 disposed between the first substrate 100 and the second substrate 102, and the transistors Tr of the active matrix layer AM are electrically connected to the light source LS. For example, at least one light emitting source 148 may be disposed in the lighting units LU1, LU2, and LU3 respectively. The light emitting source 148 may include LED, micro-LED, mini LED, or quantum dots LEDs (QLEDs or QD-LEDs), but not limited thereto. In some embodiment, the active matrix layer AM, the light source LS, the first light converting units LCU1, the second light converting units LCU2, the third light converting units LCU3, or the shielding structure 106 may be disposed on (or formed on) the first substrate 100, but not limited thereto. In some embodiments, the thickness of the shielding structure 106 may be greater than or equal to the thicknesses of the first light converting units LCU1, the second light converting units LCU2, and/or the third light converting units LCU3. In some embodiments, the filter layer FL1 may be disposed between the first light converting unit LCU1 and the second substrate 102, the filter layer FL2 may be disposed between the second light converting unit LCU2 and the second substrate 102, and an air gap or a transparent layer may be disposed between the third light converting unit LCU3 and the second substrate 102, but not limited thereto. In some embodiments, the filter layer FL1 and the filter layer FL2 can be selectively removed or replaced.

In summary, the lighting device may include a substrate disposed on the first light converting units, the second light converting units or the third light converting units. The substrate may include the metal ions, the nanoparticles, the yellowing polymer, or combinations thereof, but not limited. The transmittance of the second substrate at the wavelength corresponding to the blue light can be reduced. When the blue light unconverted by the quantum dots in the first light converting units or the second light converting units passes through the second substrate, some of the unconverted blue light may be reduced, so the intensity of the blue light in the output light may be reduced. Accordingly, the lighting units in the lighting device can emit lights with the color closer to red primary color or green primary color due to the reduction of the unconverted blue light, thereby increasing the (display) quality.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
   a substrate comprising an edge;
   a shielding structure disposed on the substrate and close to the edge, wherein the shielding structure comprises a first surface away from the substrate, a first inclined surface, a second inclined surface and a second surface, wherein the second surface is connected between the first inclined surface and the second inclined surface; and
   a layer disposed on the substrate,
   wherein the second surface, the first inclined surface and the second inclined surface of the shielding structure form a continuous surface, and in a cross-sectional view of the electronic device, the layer is directly contacted with the continuous surface and completely cover the continuous surface;
   wherein the first inclined surface is disposed between the first surface and the second surface, and the second inclined surface is disposed between the second surface and a top surface of the substrate;
   wherein in the cross-section view of the electronic device, a first slope of the first inclined surface is different from a second slope of the second inclined surface.

2. The electronic device of claim 1, further comprising:
   a light source, wherein a quantum dot cell comprising the substrate is disposed between a display panel and the light source, and the light source emits a light passing through a plurality of first light converting units and the substrate to generate a first spectrum comprising a main peak between 520 nanometers (nm) to 590 nm and a first sub peak between 430 nm to 470 nm, wherein a first transmittance of the substrate at a wavelength of the main peak is greater than a second transmittance of the substrate at a wavelength of the first sub peak.

3. The electronic device of claim 2, wherein the plurality of first light converting units are disposed between the substrate and the light source.

4. The electronic device of claim 3, wherein at least one of the plurality of first light converting units comprises a light converting structure and a filter layer.

5. The electronic device of claim 1, further comprising:
a light source, wherein a quantum dot cell comprising the substrate is disposed between a display panel and the light source, and the light source emits a light passing through a plurality of first light converting units and the substrate to generate a first spectrum comprising a main peak between 520 nanometers (nm) to 590 nm and a second sub peak between 470 nm to 510 nm, wherein a first transmittance of the substrate at a wavelength of the main peak is greater than a third transmittance of the substrate at a wavelength of the second sub peak.

6. The electronic device of claim 1, further comprising:
a light source, wherein a quantum dot cell comprising the substrate is disposed between a display panel and the light source, and the light source emits a light passing through a plurality of second light converting units and the substrate to generate a second spectrum comprising a main peak between 591 nanometers (nm) to 780 nm and a sub peak between 430 nm to 470 nm, wherein a fourth transmittance of the substrate at a wavelength of the main peak is greater than a fifth transmittance of the substrate at a wavelength of the sub peak.

7. The electronic device of claim 1, wherein the second inclined surface is adjacent to the substrate, and an absolute value of the first slope is greater than an absolute value of the second slope.

8. The electronic device of claim 1, wherein the layer is a planarization layer.

9. The electronic device of claim 1, wherein in the cross-section view of the electronic device, both of the first slope and the second slope are positive, or both of the first slope and the second slope are negative.

* * * * *